United States Patent
Petrovic et al.

(10) Patent No.: US 10,044,382 B2
(45) Date of Patent: *Aug. 7, 2018

(54) DYNAMIC BIAS CONTROL

(71) Applicant: Entropic Communications, LLC, Carlsbad, CA (US)

(72) Inventors: Branislav Petrovic, La Jolla, CA (US); Michael Farese, San Diego, CA (US)

(73) Assignee: Entropic Communications, LLC, Carlsbad, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/260,563

(22) Filed: Sep. 9, 2016

(65) Prior Publication Data

US 2017/0005677 A1    Jan. 5, 2017

Related U.S. Application Data

(63) Continuation of application No. 14/505,223, filed on Oct. 2, 2014, now Pat. No. 9,473,082.

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0222* (2013.01); *H03F 1/3241* (2013.01); *H03F 3/19* (2013.01); *H03F 3/191* (2013.01); *H03F 3/21* (2013.01); *H03G 3/004* (2013.01); *H03H 21/0012* (2013.01); *H04B 1/0017* (2013.01); *H03F 2200/165* (2013.01); *H03F 2200/451* (2013.01); *H03H 2021/0085* (2013.01); *H04B 2001/0408* (2013.01); *H04B 2001/0416* (2013.01); *H04B 2001/0425* (2013.01)

(58) Field of Classification Search
CPC ............... H04B 1/0475; H04B 1/0017; H04B 2001/0408; H04B 2001/0416; H04B 2001/0425; H03F 1/0222; H03F 1/3241; H03F 3/19; H03F 3/191; H03F 3/21; H03F 2200/165; H03F 2200/451; H03G 3/004; H03H 21/0012; H03H 2021/0085
See application file for complete search history.

(56) References Cited

U.S. PATENT DOCUMENTS 3,942,121 A *  3/1976  Bell ............... H03J 5/0245
                                                      455/160.1
9,473,082 B2 * 10/2016  Petrovic ............ H04B 1/0475
(Continued)

*Primary Examiner* — Michelle M Koeth
(74) *Attorney, Agent, or Firm* — McAndrews, Held & Malloy, Ltd.

(57) ABSTRACT

Systems and methods for controlling a power amplifier includes combining a digital modulated data signal with a digital bias signal to generate a combined digital signal, the digital bias signal generated based on an envelope for the modulated data signal; converting, by a digital-to-analog converter, the combined digital signal into a combined analog signal, the combined analog signal comprising an analog modulated data signal and an analog envelope bias signal; and separating the analog modulated data signal and the analog bias signal onto separate signal paths, wherein the converting is performed using a single digital-to-analog converter.

19 Claims, 14 Drawing Sheets

(51) Int. Cl.
      *H03F 3/191*      (2006.01)
      *H03G 3/00*      (2006.01)
      *H03F 1/32*      (2006.01)
      *H03F 3/19*      (2006.01)
      *H03F 3/21*      (2006.01)
      *H03H 21/00*      (2006.01)
      *H04B 1/00*      (2006.01)

(56) References Cited

U.S. PATENT DOCUMENTS

| | | | |
|---|---|---|---|
| 2004/0227621 A1 | 11/2004 | Cope et al. | |
| 2005/0127963 A1 | 6/2005 | Johnson | |
| 2007/0249304 A1* | 10/2007 | Snelgrove | H03F 1/0205 |
| | | | 455/127.2 |
| 2008/0139140 A1 | 6/2008 | Matero et al. | |
| 2009/0121844 A1* | 5/2009 | Repke | H04Q 9/00 |
| | | | 340/10.42 |
| 2011/0050337 A1 | 3/2011 | Ito et al. | |
| 2013/0040682 A1 | 2/2013 | Chang et al. | |
| 2015/0031318 A1* | 1/2015 | McCallister | H03F 1/3247 |
| | | | 455/114.3 |
| 2015/0162882 A1 | 6/2015 | Tam et al. | |
| 2015/0207461 A1* | 7/2015 | Bhatia | H03F 3/21 |
| | | | 330/296 |
| 2016/0020862 A1* | 1/2016 | Morshedi | H04B 17/12 |
| | | | 455/77 |

* cited by examiner

-- Prior Art --

DYNAMIC BIAS CONTROL

CROSS-REFERENCE TO RELATED APPLICATIONS

This application is a continuation of U.S. patent application Ser. No. 14/505,223, filed Oct. 2, 2014, which is incorporated herein by reference in its the entirety.

TECHNICAL FIELD

The disclosed technology relates generally to satellite communications, and more particularly, some embodiments relate to improved signal processing techniques for satellite signals.

DESCRIPTION OF THE RELATED ART

Continued advances in wireless communications have brought about a dramatic increase in the proliferation of cellular telephones, tablets and other portable electronic devices for the communication of media, messages and other data among various users. Such devices are not limited to accessing media content and other data via mobile networks, but instead are able to connect using multiple networks, such as for example, WiFi networks (e.g., IEEE 802.11™, promulgated by the Institute of Electrical and Electronics Engineers, Inc., 3 Park Avenue, New York, N.Y. 10016-5997, USA), other IEEE 802® networks, Bluetooth® networks, and others.

Consider WiFi applications as an example. Typically, WiFi-enabled cellular telephones are able to exchange media content, messages and other data via either a cellular network (e.g., 3G, 4G, 4GLTE, etc.) a WiFi or the like. Accordingly, users can leverage wireless access points to access the Internet, an available intranet or other network. As a result of this available connectivity, the relatively high data rates offered by WiFi standards, and the increasing costs of cellular data, WiFi access points have become ubiquitous in contemporary homes, offices, businesses, and in public places as well.

FIG. 1 is a diagram illustrating an example network such as a WiFi network. In the example shown in FIG. 1, a number of wireless devices 53 having at least a WiFi-compatible interface are shown. Although illustrated as wireless handsets, wireless devices 53 can include cellular or satellite telephones and other handsets, tablets, PDAs, portable computing devices, desktop computing devices, and other devices and equipment having wireless communication capability. Also shown in the example of FIG. 1 are a plurality of wireless routers 51. In terms of the WiFi example, wireless routers 51 may be implemented as WiFi routers compatible with one or more of the IEEE 802.11 standards. In some environments, a network controller 52 can be included to manage multiple wireless routers 51 and their communications with an intranet 59 or the outside world. In the example shown in FIG. 1, wireless routers 51 are connected to the Internet 55 by way of an Internet service provider 52.

In order to enable wireless network communications, wireless devices 53 in the network and wireless routers 51 may include a communication system configured in accordance with the designated standard. For example, the transceivers can include baseband processing, a communication transceiver and a front-end amplifier. FIG. 2 is a diagram illustrating an example implementation of a conventional communication system that can be used for wireless communications such as, for example, WiFi or other wireless communications. The example of FIG. 2 includes a baseband module 220, a narrowband transceiver 230, a transmit/receive module 236 and an antenna. Transmit/receive module module 236 includes a power amplifier PA to amplify the transmit signal for transmission and a low noise amplifier LNA. Preferably, the low noise amplifier is located as close to the signal source (e.g., the antenna) as possible to avoid amplifying additionally introduce noise.

Also shown in the example of FIG. 2 is a transmit/receive switch 238 to switch between the transmit and receive modes. When in the transmit mode, signals from the power amplifier PA are routed to the antenna. When in the receive mode, signals from the antenna are routed to the low noise amplifier LNA. In a time division duplex (TDD) system, the transceiver is configured alternately in either the transmit or receive mode.

Baseband module 220 includes a baseband DSP 222 and a plurality of analog-to-digital converters (ADC) and a digital-to-analog converters (DAC). In most conventional configurations, the interface to the baseband module 220 is an analog interface, and communications on the I and Q channels between baseband module 220 and narrowband transceiver 230 are in the form of analog signals. For transmit operations, data for the I and Q channels is processed digitally using baseband DSP 222. This digital data is converted to analog form using digital-to-analog converters (DACs) and transmitted across the analog interface 224 to the transceiver 230. For receive operations, the analog signals received by the system are converted to digital information by the analog-to-digital converters (ADCs) for baseband processing at baseband digital signal processor 222.

Narrowband transceiver 230 includes a transmit chain and a receive chain. On the transmit side, analog signals in the form of the I and Q channels are received and modulated onto a carrier, or a converted, for transmission. One or more variable gain amplifiers can be included to provide gain control for the analog signals. Also, low pass filters (LPFs) can be used to filter out unwanted noise outside of the frequency band. The I and Q channels are combined and provided to the power amplifier PA for amplification and subsequent transmission. On the receive side, the amplified signal from the low noise amplifier LNA is downconverted in one or more stages to, for example, a zero IF signal. The downconverted signal on the I and Q channels is provided to baseband module 220 for processing. The receive side can also include low pass filters (LPFs) which remove unwanted noise, and variable gain amplifiers to provide appropriate signal levels.

FIG. 3 is a diagram illustrating another example of a communication transceiver. This example is that of a 4×4 MIMO transceiver such as can be used, for example, in WiFi or in other communication applications. This example essentially includes the architecture of FIG. 2 replicated four times, one for each MIMO transceiver. As this illustrates, this architecture leads to a high-density configuration and includes an analog interface between baseband module 220, and transceivers 230 with a total of 16 signals across the interface.

BRIEF SUMMARY OF EMBODIMENTS

According to various embodiments of the disclosed technology systems and methods may be provided in which a communication system may include: a digital tuner having an input and an output, the digital tuner configured to output a modulated data signal; an envelope computation module having an input and an output, and configured to provide a bias signal at its output; a combiner having a first input coupled to the output of the digital tuner and a second input coupled to the output of the envelope computation module, and an output, the combiner configured to generate a combined signal by combining the modulated data signal with the bias signal; a DAC having an input coupled to the output of the combiner and an output; a power amplifier having a signal input, a control input and an output; a high pass filter having an input coupled to the output of the DAC and an output coupled to the signal input of the power amplifier; and a low pass filter having an input coupled to the output of the DAC and an output coupled to the control input of the power amplifier.

In various embodiments, the high pass filter may be configured to filter out the bias signal from the combined signal and to pass the modulated data signal to the input of the power amplifier for amplification. In further embodiments, the low pass filter may be configured to filter out the modulated data signal from the combined signal and to pass the bias signal to the control input of the power amplifier to control the bias of the power amplifier. The bias signal and the modulated data signal may be sufficiently separated from one another in frequency so as to not destructively interfere with one another upon being combined by the combiner. In various embodiments, a single DAC may be used to convert the modulated data signal and the bias signal into an analog combined signal.

In some embodiments, the envelope computation module may be configured to compute a complement of the envelope. In further embodiments, the envelope computation module computes the complement of the envelope to reduce the digital-to-analog converter's dynamic range requirements.

Embodiments may include a modulator having an output coupled to the input of the digital tuner. Some embodiments may include an adaptive filter coupled between the envelope computation module and the combiner. The adaptive filter may include an input coupled to the output of the envelope computation module and an output coupled to the second input of the combiner.

A return path may be provided and coupled to an input of the adaptive filter to provide signal information to train the adaptive filter. The adaptive filter may be configured to measure signal distortion and provide pre-distortion for the communication system. A bias conditioner may be included to extract an original envelope for the modulated data signal to ensure that the analog bias signal may be substantially in phase with the analog modulated data signal at the power amplifier.

A method for controlling a power amplifier may include combining a Digital modulated data signal with a digital bias signal to generate a combined digital signal, the digital bias signal generated based on an envelope for the modulated data signal; converting, by a digital-to-analog converter, the combined digital signal into a combined analog signal, the combined analog signal including an analog modulated data signal and an analog envelope bias signal; and separating the analog modulated data signal and the analog bias signal onto separate signal paths. In some embodiments, the converting may be performed using a single digital-to-analog converter.

Separating may include filtering out the analog bias signal from the combined analog signal and passing the analog modulated data signal to a power amplifier for amplification. Separating may further include filtering out the analog modulated data signal from the analog combined signal and passing the analog bias signal to a control input of a power amplifier to control the bias of the power amplifier.

Embodiments may include filtering, using an adaptive filter, the digital bias signal prior to combining it with the digital modulated data signal. Embodiments may include extracting the original envelope for the modulated data signal to ensure that the analog bias signal may be substantially in phase with the analog modulated data signal at the power amplifier. The analog modulated data signal may be provided to an input of a power amplifier, and the analog bias signal may be provided to a control input of the power amplifier.

In other embodiments, a power amplifier is included for amplifying the analog modulated data signal, wherein the power amplifier may be controlled by the analog bias signal. The amplified modulated data signal may be transmitted, for example, via an antenna. Embodiments may include measuring signal distortion of the signal to provide pre-distortion of the signal.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

In accordance with various embodiments, a wireless communication system can be implemented in which one or more analog-to-digital converters and one or more digital-to-analog converters can be shared by various communication paths. Embodiments of a communication transceiver can be implemented using digital tuners and other digital signal processing blocks that can be interfaced to a baseband module having an analog interface without requiring analog-to-digital converters or digital-to-analog converters dedicated to that interface. In some embodiments, conventional tuning functions such as modulation, demodulation, and filtering can be performed in the digital domain and the analog-to-digital and digital-to-analog converters used by the transceiver for the interface with the PA/LNA block (i.e, transmit/receive module) can be switched to also provide the analog interface to the baseband module. In other embodiments, digital interfaces between the communication transceiver and the baseband module can be provided.

Figure 4:
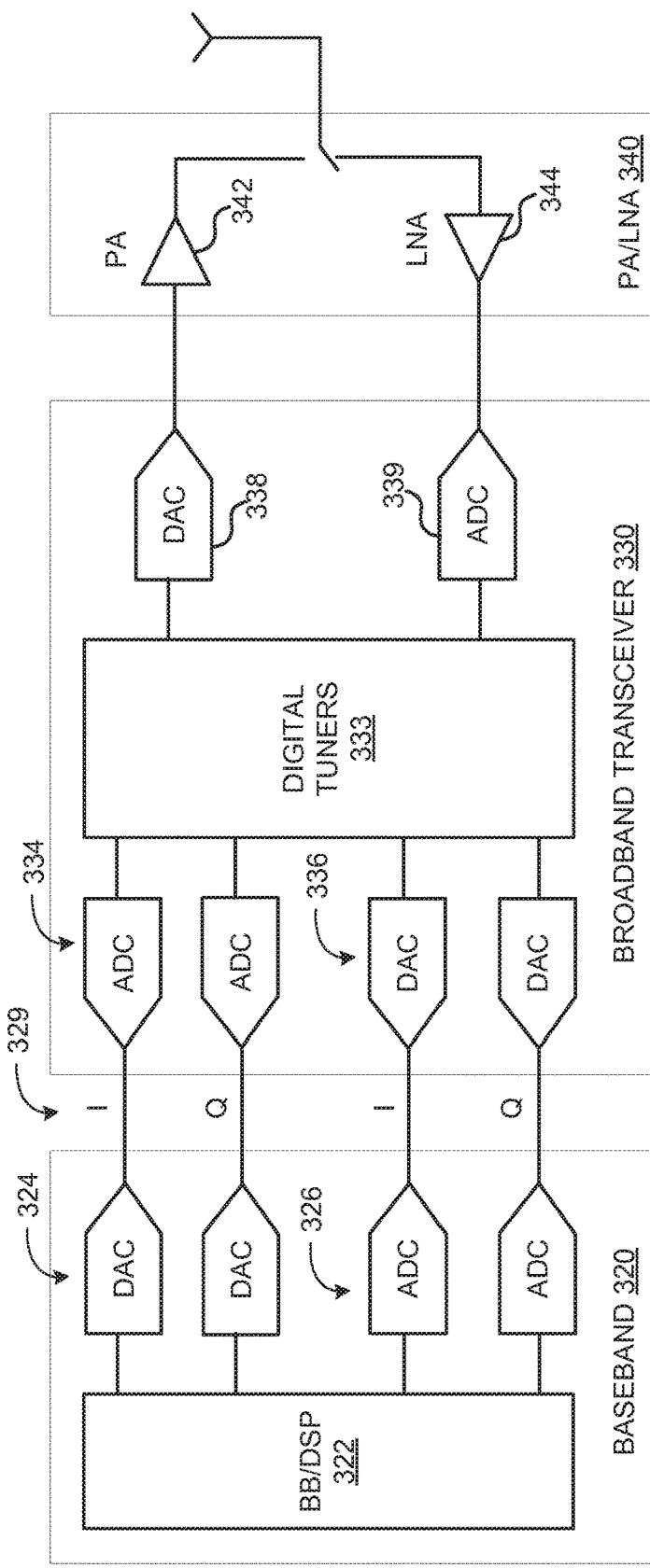
FIG. 4 is a diagram illustrating one example of a communication system using digital tuning in accordance with one embodiment of the systems and methods disclosed herein.

FIG. 4 is a diagram illustrating one example of a communication system using digital tuning in accordance with one embodiment of the systems and methods disclosed herein. In the example of FIG. 4, the communication system includes a baseband module 320, a transceiver 330 (e.g., a broadband transceiver), and a transmit/receive module 340. Baseband module 320 includes baseband circuitry 322 and a plurality of digital-to-analog converters 324 and analog-to-digital converters 326. Baseband circuitry 322 can be implemented, for example, using one or more digital signal processors with suitable program code to perform the baseband data processing. Digital-to-analog converters 324 and analog-to-digital converters 326 provide an analog interface 329 between baseband module 320 and transceiver 330 (which may be a broadband transceiver). As seen in this example, the I and Q channels for the transmit and receive functions are sent using separate signal paths each with a dedicated pair of analog-to-digital and digital-to-analog converters.

Digital tuners 333 can include circuitry to provide the transmit and receive tuning functions for the transceiver. For example, digital tuners 333 can include bandpass filtering to eliminate noise, modulation for modulating the baseband data onto a carrier for transmission (e.g., 2.4 GHz or 5 GHz in the case of WiFi), demodulating the received data for conversion to I/F or baseband, and other like tuner functions. Digital tuners 333 can be implemented using digital circuitry or one or more digital signal processors running program code configured to perform the transceiver operations. Digital-to-analog converter 338 can be provided to convert the digital signal to analog form for transmission across a wireless network. Likewise, analog-to-digital converter 339 can be provided to accept received analog signals and convert them to digital form for digital demodulation and filtering.

Transmit/receive module 340 provides amplification of the transmit and receive signals. A power amplifier 342 is included to amplify the modulated signal for transmission over the wireless interface. A low noise amplifier 344 is provided to amplify the received signals to sufficient levels to enable proper reception of the signal. Low noise amplifier 344 is ideally provided as close to the source as possible to minimize the amount of noise amplified by the LNA.

Figure 5:
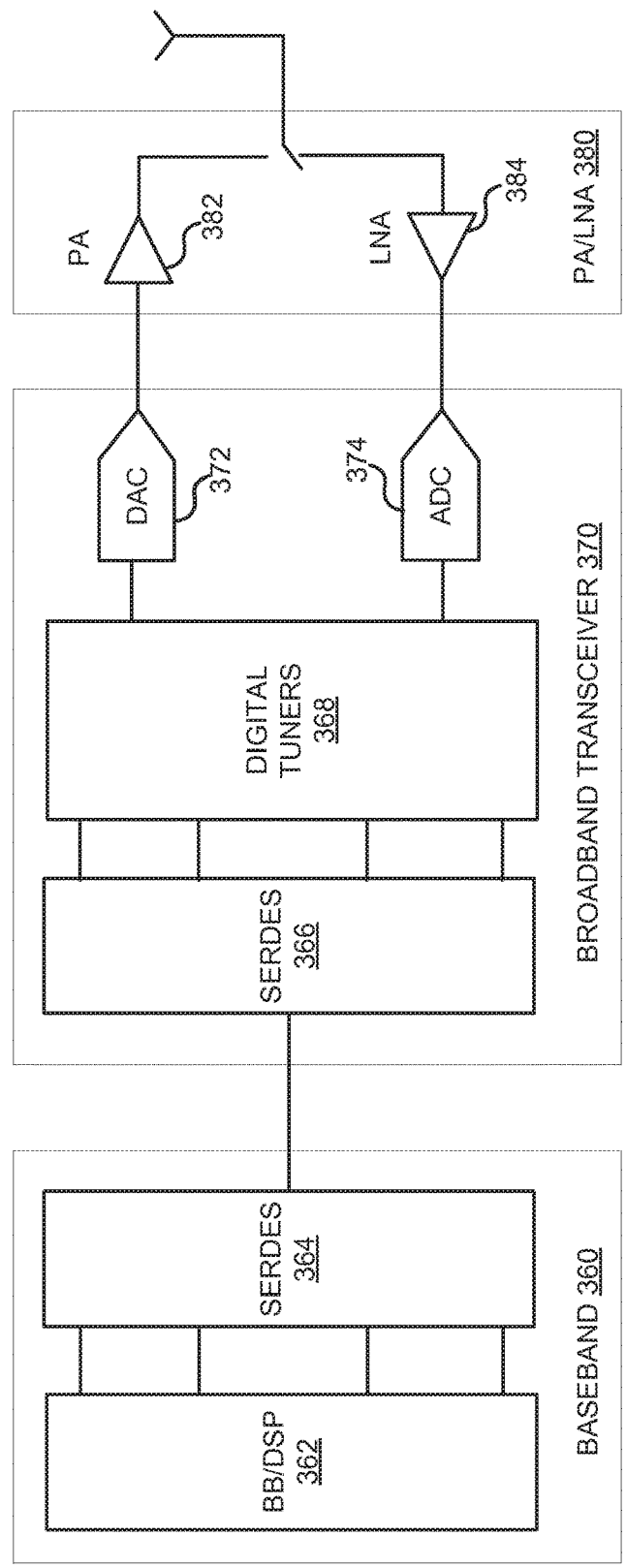
FIG. 5 is a diagram illustrating one example of a communication system having a digital broadband transceiver in accordance with one embodiment of the technology disclosed herein.

FIG. 5 is a diagram illustrating one example of a communication system having a digital broadband transceiver in accordance with one embodiment of the technology disclosed herein. In this example, baseband module 360 is provided to perform the baseband processing and data handling for transmitted and received data. Baseband module 360 in this example includes baseband circuitry 362 and a serializer/deserializer 364 (SerDes). Baseband circuitry 362 can be implemented, for example, using one or more digital signal processors with suitable program code to perform the baseband data processing. Serializer/deserializer 364 can be implemented to allow communication of the I and Q channels for transmit and receive data across a serial communication link. This can minimize the number of physical interfaces between baseband module 360 and broadband transceiver 370. This also allows a digital interface between baseband module 360 and broadband transceiver 370 thereby obviating the need for ADCs and DACs (analog-to-digital and digital-to-analog converters) to support an analog interface between the two. This can be contrasted to the example of FIG. 4, which uses digital-to-analog converters 324, 334 and analog-to-digital converters 326, 336 to provide the analog interface.

In the example of FIG. 5, broadband transceiver 370 includes a serializer/deserializer 366 (SerDes), digital tuners 368, a digital-to-analog converter 372, and analog-to-digital converter 374. Serializer/deserializer 366 provides a digital interface between broadband transceiver 370 and baseband module 360. Serializer/deserializer 366 may be implemented in much the same way as Serializer/deserializer 364.

Digital tuners 368 can include circuitry to provide the transmit and receive tuning functions for the transceiver. Digital tuners 368 can be implemented using digital circuitry or one or more digital signal processors running program code configured to perform the transceiver operations. For example, digital tuners 368 can include bandpass filtering to eliminate noise, modulation for modulating the baseband data onto a carrier for transmission (e.g., 2.4 GHz or 5 GHz in the case of WiFi), demodulation for demodulating the received data for conversion to I/F or baseband, and other like tuner functions. Digital-to-analog converter 372 can be provided to convert the digital signal to analog form for transmission across a wireless network. Likewise, analog-to-digital converter 374 can be provided to accept received analog signals and convert them to digital form for digital downconversion and filtering.

Transmit/receive module 380 provides amplification of the transmit and receive signals. A power amplifier 382 is included to amplify the modulated signal for transmission over the wireless interface. A low noise amplifier 384 is provided to amplify the received signals to sufficient levels to enable proper reception of the signal. Low noise amplifier 384 is ideally provided as close to the source as possible or practical to minimize the amount of noise amplified by the LNA.

Figure 1:
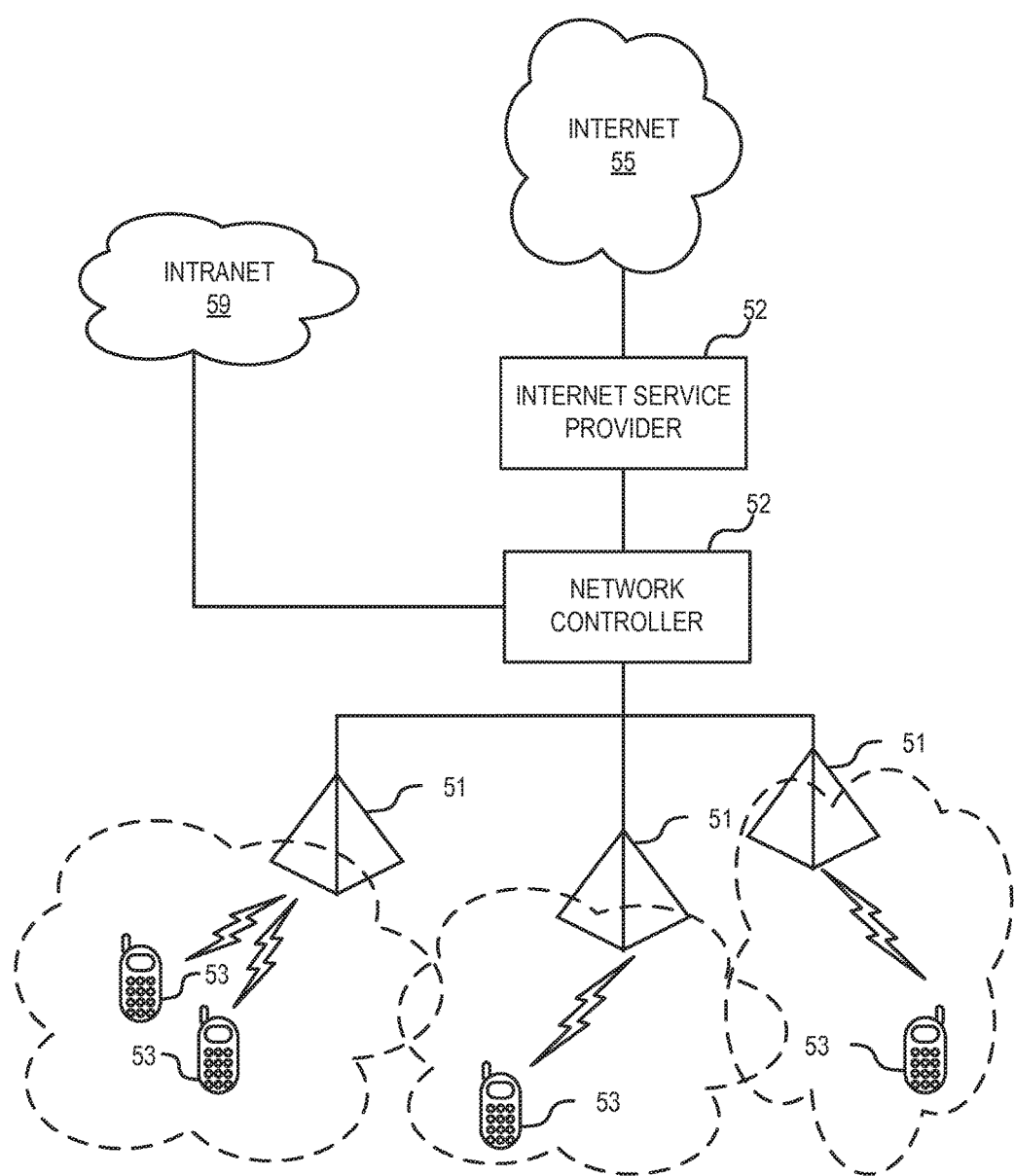
FIG. 1 is a diagram illustrating a wireless network having multiple wireless routers.
Figure 2:
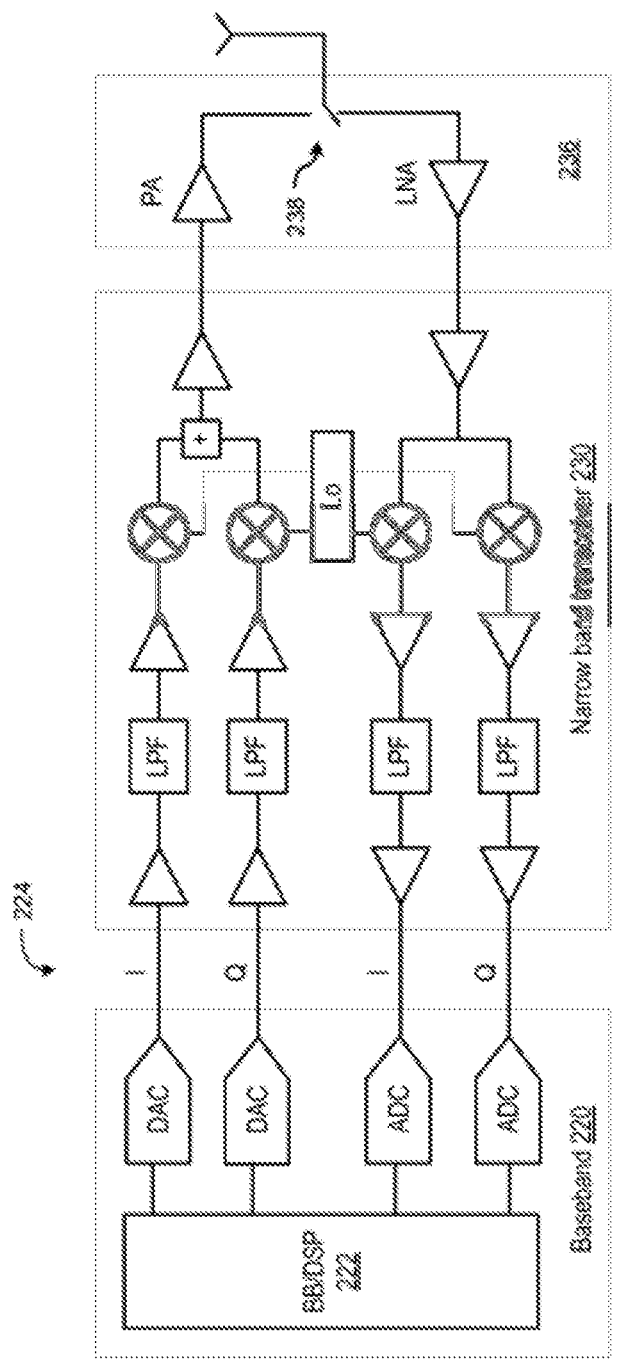
FIG. 2 is a diagram illustrating an example implementation of an analog transceiver interfacing to a baseband module.
Figure 3:
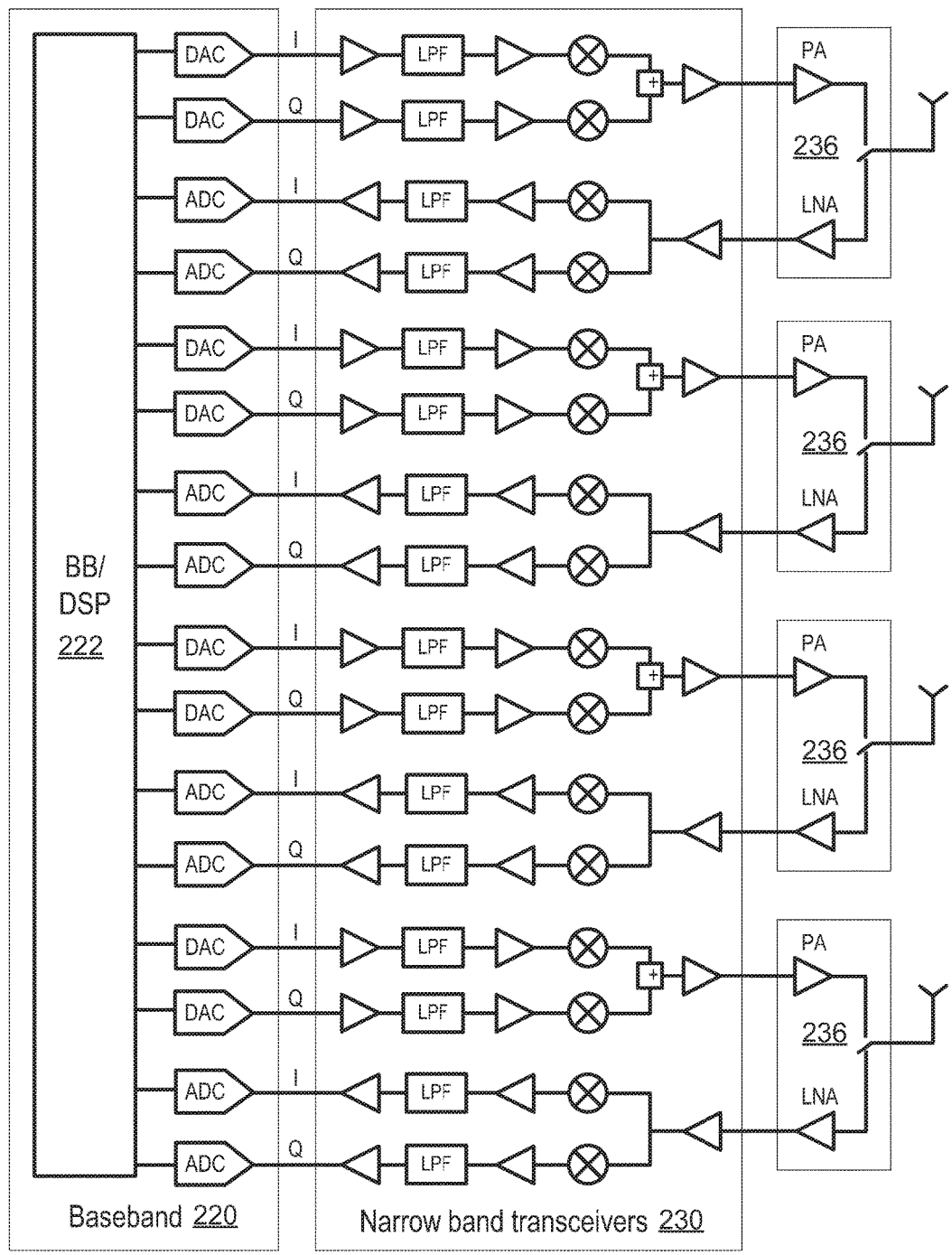
FIG. 3 is a diagram illustrating another example of a communication transceiver interfacing to a baseband module.

The example communication systems shown in FIGS. 4 and 5 are illustrated in these examples as time division duplexing (TDD) communication systems in which transmit and receive operations are separated in time. The example communication systems shown in FIGS. 4 and 5 can be implemented for any of a number of different wireless devices communicating via any of a number of different wireless protocols. For example, these communication systems can be implemented for WiFi or other IEEE 802 wireless standards, satellite communications equipment, Bluetooth communications equipment, and so on. While the example illustrated in FIG. 5 allows a digital interface between the baseband module and the transceiver, the transceiver may not provide direct compatibility with commercially available baseband processing modules having analog interfaces. The example shown in FIG. 4 does not have this interface incompatibility because the transceiver includes analog-to-digital and digital-to-analog converters that provide the analog interface for compatibility with readily available baseband modules including an analog interface. However, the number of analog-to-digital and digital-to-analog converters required for such an implementation can grow quite large. This can be especially true in embodiments in which a number of different communication paths are provided such as is the case with MIMO applications. For example, consider the 4×4 MIMO application of FIG. 3 but with a digital tuning session such as that shown in FIG. 4. As one can see, this application would require that the transceiver include 16 ADC/DAC converters to implement the interface to the baseband section, and an 8×8 MIMO would require as many as 32 ADC/DAC converters.

Accordingly, various embodiments can be implemented to provide systems and methods for sharing the digital-to-analog and analog-to-digital converters to provide a more efficient interface. Particularly, in some embodiments, switching and multiplexing circuitry can be provided to allow the digital-to-analog and analog-to-digital converters at the interface between the broadband transceiver and the transmit/receive module module can be shared for use with the interface between the broadband transceiver and the baseband section. This can lead to the elimination of a certain amount of mixed-signal circuitry (e.g., ADCs and DACs) in the transceiver. An example of this is now described.

Figure 6:
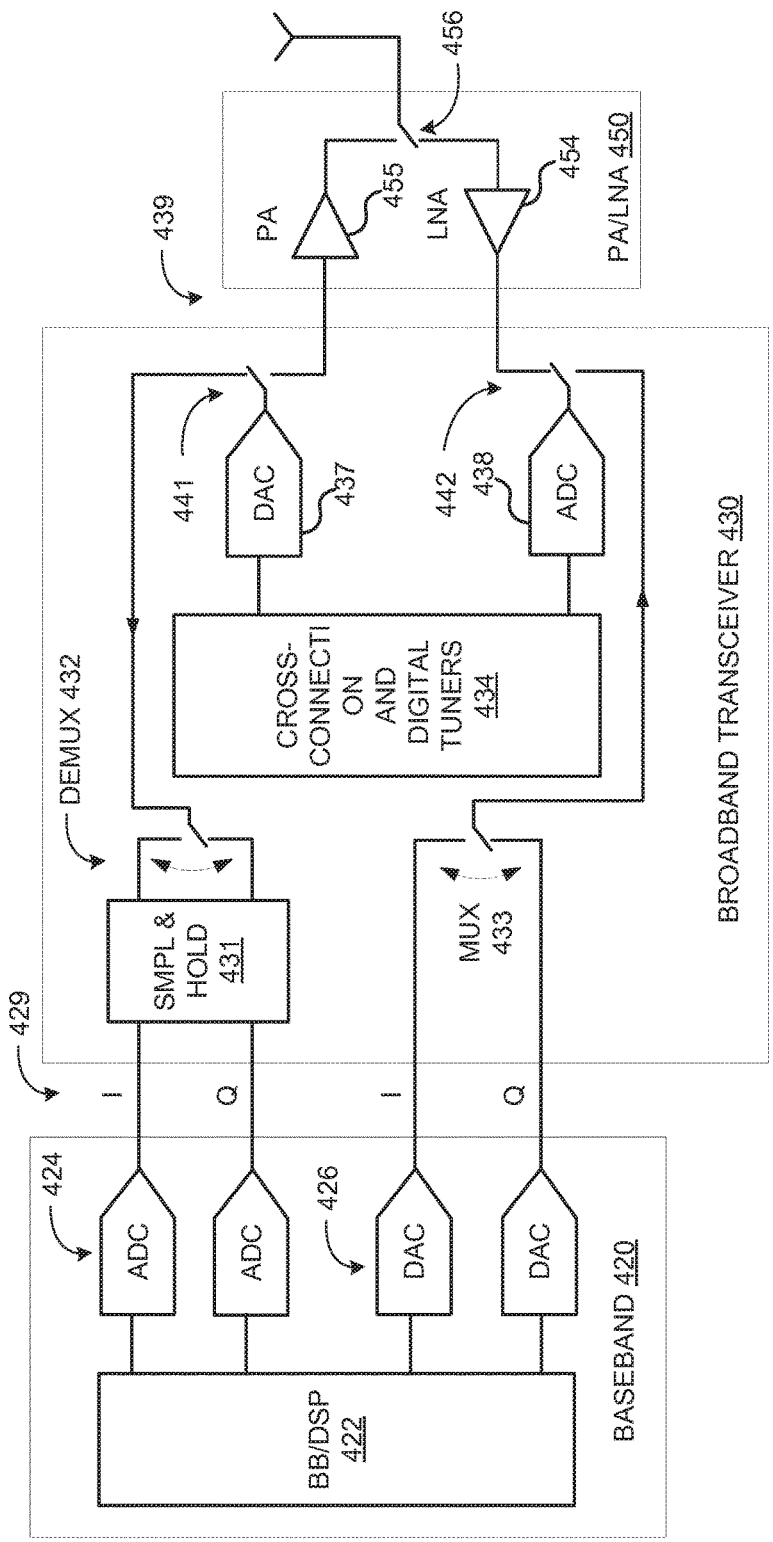
FIG. 6 is a diagram illustrating one example of shared analog-to-digital and digital-to-analog converters in accordance with one embodiment of the technology disclosed herein.

FIG. 6 is a diagram illustrating one example of shared analog-to-digital and digital-to-analog converters in accordance with one embodiment of the technology disclosed herein. In the example illustrated in FIG. 6, the communication system includes a baseband module 420, which includes baseband circuitry 422, analog-to-digital converters 424 and digital-to-analog converters 426. In some embodiments, baseband module 420 can be implemented using a baseband module and corresponding components the same as or similar to baseband module 320 of FIG. 4. As seen in this example, baseband module 420 includes an analog interface 429 for the I and Q channels for both the transmit and receive signals.

Broadband transceiver 430 in this example is implemented to provide compatibility with analog interface 429 while providing digital tuners in a digital tuning module 434. It can be seen in this example that only one digital-to-analog converter 437 and one analog-to-digital converter 438 are required to provide analog communications across analog interface 429. The same digital-to-analog converter 437 and one analog-to-digital converter 438 can be used to provide analog communications across analog interface 439. In this example, this is accomplished by providing switching mechanisms and cross connections to allow digital-to-analog converter 437 and analog-to-digital converter 438 to be shared for use with analog interface 429 and with analog interface 439. These switching mechanisms may include switches 441, 442, which can be configured to switch the input of analog-to-digital converter 438 and the output of digital-to-analog converter 437 depending on whether the communication system is in transmit or receive mode. These switching mechanisms may also include cross connections provided to switch the appropriate signals (i.e., switch the signal path from analog-to-digital converter 438 to the appropriate digital tuner for modulation or demodulation, as required; and to switch the signal path from the appropriate digital tuner for modulation or demodulation to digital-to-analog converter 437). Also provided in this example are demultiplexer 432, multiplexer 433 and sample and hold module 431. These components are described in more detail below.

As with the example embodiments described above, the digital tuning module 434 can be configured to provide modulation, demodulation and filtering for the transmit and receive signals. In some embodiments, direct conversion between RF and baseband signals can be provided by digital tuning module 434. The digital tuner circuitry, which can be implemented, at least in part, using digital signal processing, can also include cross connection circuitry to allow sharing of digital-to-analog converter 437 and analog-to-digital converter 438.

transmit/receive module 450 includes a power amplifier 455 to amplify the transmit signal for communication across the wireless interface, and a low noise amplifier 454 to amplify the received RF signal. Switch 456 switches the antenna signal between the transmitter and the receiver elements for TDD operations.

For transmit operations, analog signals for the I and Q channels are received from baseband module 420 at multiplexer 433. Multiplexer 433 multiplexes the I and Q channels into a common signal path, and the combined signal is routed to analog-to-digital converter 438. In the transmit mode, switch 442 is positioned to communicatively couple (directly or indirectly (with intervening components) electrically connect) multiplexer 433 with analog-to-digital converter 438 for conversion to a digital data stream. The digitized transmit data from analog-to-digital converter 438 is passed to the digital tuners and the cross connection circuitry. The cross connection circuitry routes the output of the analog-to-digital converter to the transmit portion of the digital tuners for modulation onto a carrier. In this embodiment, this is done in the digital domain. The modulated data stream is routed by the cross connection circuitry to digital-to-analog converter 437 where it is converted to an analog signal. Switch 441 is positioned to communicatively couple the output of digital-to-analog converter 437 to the transmit side of transmit/receive module 450. Particularly, the signal is routed to the power amplifier 455 and switched by switch 456 to the antenna for transmission.

For receive operations, switches 441, 442, and 456 are placed in the positions as shown in FIG. 6 such that RF signals received by the antenna can be routed to low noise amplifier 454 and then routed to analog-to-digital converter 438. The received, digitized RF signals are routed by the cross connection circuitry to the receive portion of digital tuning module 434 where they can be downconverted to baseband or zero-IF signals. In some embodiments, direct conversion can be employed to downconvert the signal directly to baseband without the need to convert to an intermediate IF signal.

The downconverted signal is routed by the cross connection circuitry to digital-to-analog converter 437 where it is converted to an analog signal and routed to sample and hold module 431. Demultiplexer 432 demultiplexes the analog received signal into separate I and Q channels. After one of the I and Q channel signals is clocked into sample and hold module 431, it is held (e.g., in memory, a holding capacitor or other storage) while the other one of the I in Q channel signals is clocked in. Then, both the I and the Q channels can be released to baseband module 420 at the same time (sufficiently in sync to allow proper reception by baseband module 420).

Figure 7:
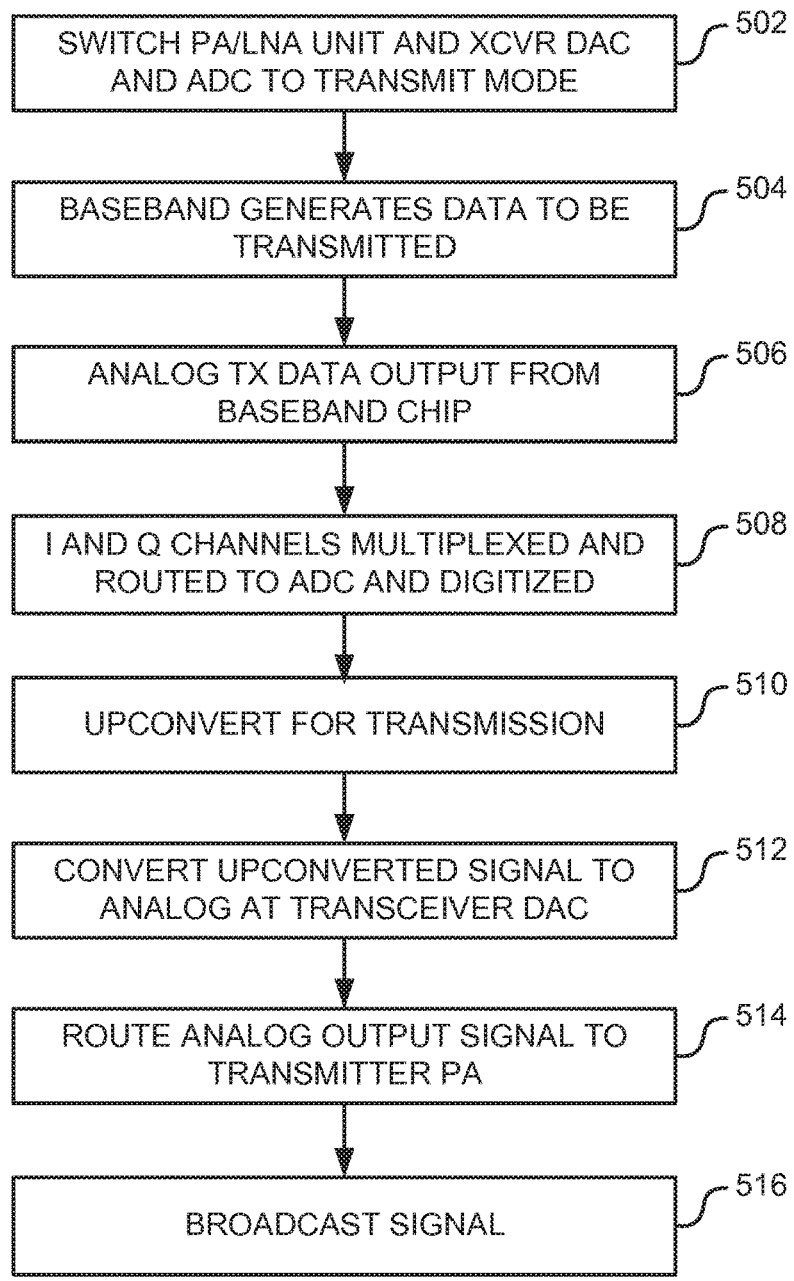
FIG. 7 is an operational flow diagram illustrating an example process for implementing the transceiver interface for transmitter operations in accordance with one embodiment of the technology disclosed herein.

FIG. 7 is an operational flow diagram illustrating one example process for implementing the transceiver interface for transmitter operations in accordance with one embodiment of the technology disclosed herein. Referring now to FIGS. 6 & 7, at operation 502, switches 456, 441 and 442 are set to the transmit mode (which is the opposite setting of that illustrated for those switches in the example of FIG. 6). This communicatively couples (directly or indirectly) the output of digital-to-analog converter 437 with the input of power amplifier 455, the output of power amplifier 455 to the feed of the antenna, and the output of multiplexer 433 to the input of analog-to-digital converter 438.

At operation 504, baseband module 420 generates or provides the baseband signal for transmission. At operation 506, this data is converted to analog data by digital-to-analog converters 426 and sent by baseband module 420 to broadband transceiver 430 via analog interface 429 and sent across analog interface 429. At operation 508, the I and Q channel signals are multiplexed onto a single communication path and routed to analog-to-digital converter 438 (via switch 442) where they are digitized. For example, multiplexer 433 can be configured to multiplex or interleave the I and Q channels into a single analog stream. At operation 510, this digitized data is routed to digital tuners in digital tuning module 434 and digitally modulated onto the designated carrier. At operation 512, the modulated data is converted to analog data via digital-to-analog converter 437 and routed via switch 441 to power amplifier 455 at operation 514. The amplified signal is routed via switch 456 for transmission by the antenna at operation 516.

Figure 8:
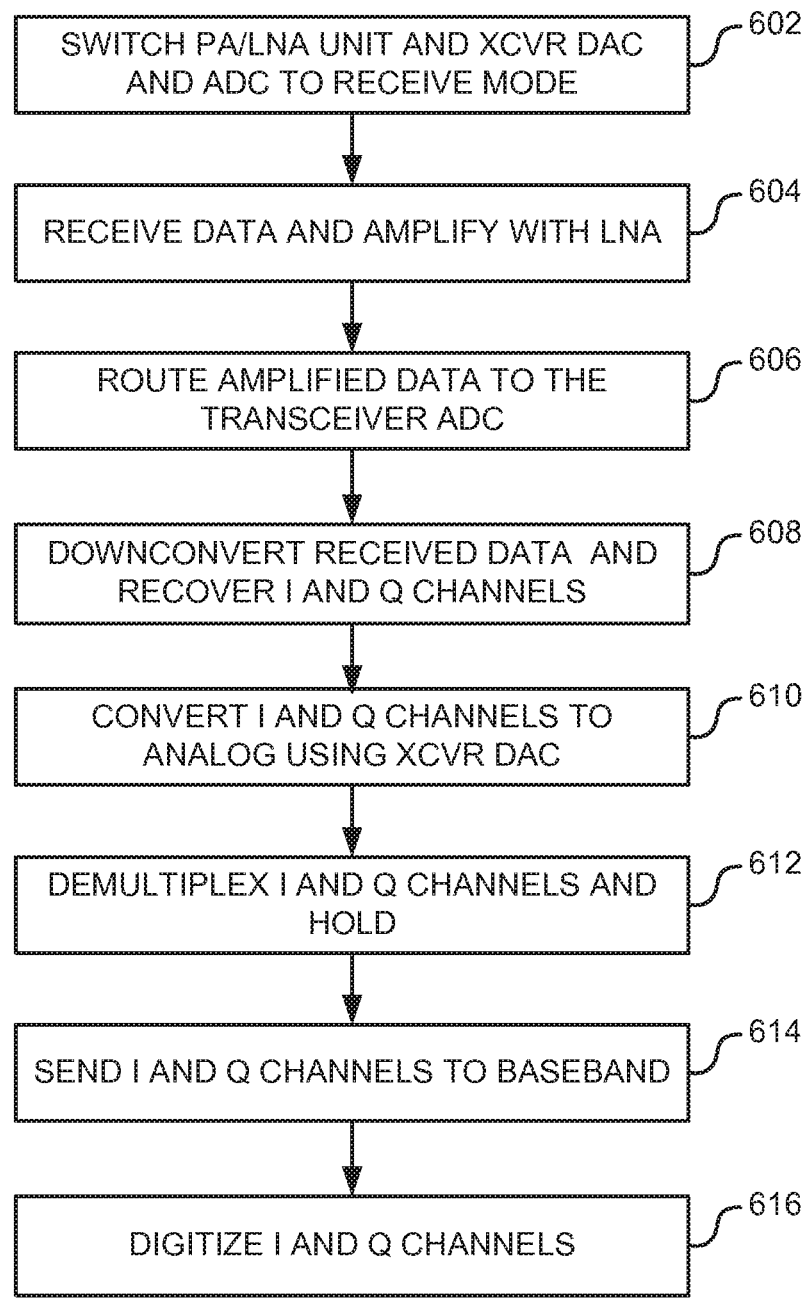
FIG. 8 is a diagram illustrating an example process for receive operations in accordance with one embodiment of the technology disclosed herein.

Having thus described an example of the transmit operations, an example of the receive operations is now described. FIG. 8 is a diagram illustrating an example process for receive operations in accordance with one embodiment of the technology disclosed herein. With reference now to FIGS. 6 and 8, at operation 602, switches 456, 441, and 442, are placed in their receive configurations. In one embodiment, these are the configurations as shown in FIG. 6, in which switch 456 communicatively couples the antenna to low noise amplifier 454, low noise amplifier 454 to analog-to-digital converter 438, and digital-to-analog converter 437 to demultiplexer 432. At operation 604, transmitted signals are received by the antenna and routed to the low noise amplifier 454 via switch 456. Low noise amplifier 454 receives the received signal and amplifies it to appropriate levels for the receiver of broadband transceiver 430.

At operation 606, the amplified data from the low noise amplifier is routed to analog-to-digital converter 438 via switch 442. Analog-to-digital converter 438 digitizes the signal so it can be processed by digital tuners in digital tuning module 434. The digitized data is routed to the digital tuners via cross connection circuitry. At operation 608, a receive section of digital tuning module 434 recovers the I and Q channels and down converts the received data. As noted above, in some embodiments this can be a direct downconversion (e.g., to zero IF). The I and Q channels are converted to analog signals using digital-to-analog converter 437. This is illustrated as operation 610. This analog signal is routed via switch 441 to demultiplexer 432. At operation 612, demultiplexer 432 demultiplexes the I and Q, channels onto separate signal paths and holds the first of the two until the other one is ready to be provided to baseband module 420. Then, at operation 614, the I and Q signals are sent at the same time to the baseband module 420. At operation 616, the analog I and Q channels are digitized using analog-to-digital converters 424 such that they can be processed by baseband module 420.

As these examples illustrate, embodiments can be implemented for both the transmit and receive operations in which a communication transceiver can interface with an analog baseband module and a PA/LNA block using a single digital-to-analog converter and a single analog-to-digital converter for a given communication channel.

Figure 9:
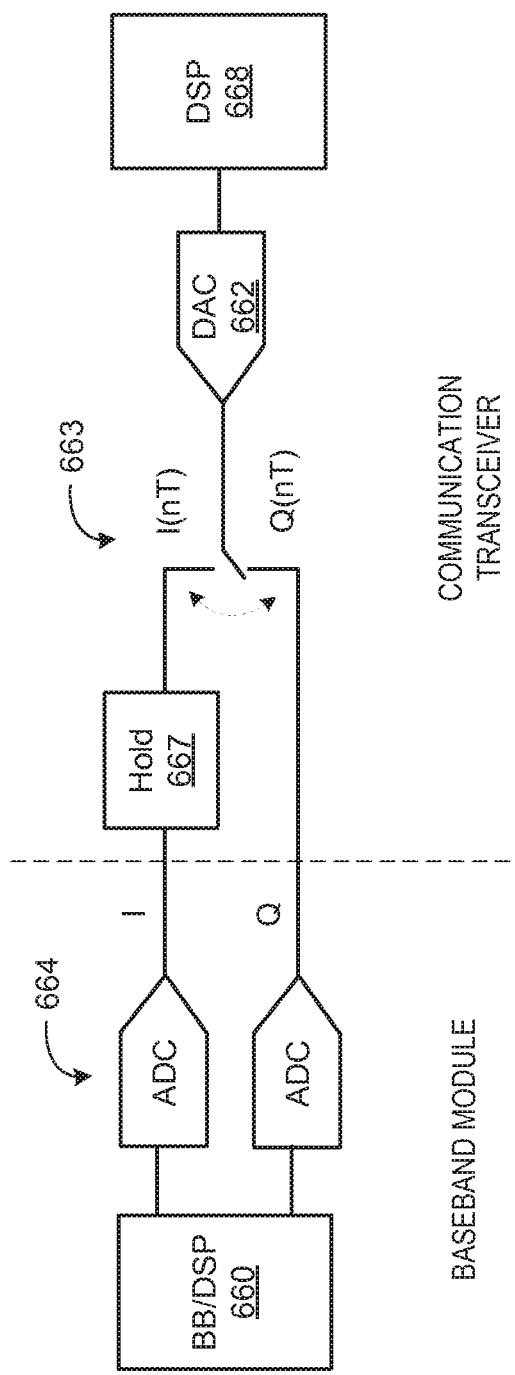
FIG. 9 is a diagram illustrating an example implementation for a hold circuit in accordance with one embodiment of the technology disclosed herein.

As noted above, in the example embodiment of FIG. 6, a hold circuit is provided to allow the I and Q channel signals to be sent to the baseband module at the same time (at least sufficiently simultaneous to allow proper receipt and processing by the baseband module). FIG. 9 is a diagram illustrating an example implementation for a hold circuit in accordance with one embodiment of the technology disclosed herein. As described above, receive signals are digitized and down converted to recover the data using digital tuners. Digital tuners can be implemented using any of a number of digital techniques, including for example, a DSP (DSP 668) with associated memory and program code. The output of DSP 668 is converted to an analog signal by a digital-to-analog converter 662 and provided to the multiplexer 663. Multiplexer 663 demultiplexes the analog signal to separate the I and Q channels into separate signals. In the illustrated example, the I channel is provided at the top branch of the circuit and Q channel is provided at the bottom branch of the circuit. Hold circuit 667 is loaded with the value for the I signal and the demultiplexer switches such that digital-to-analog converter 662 provides the Q value to multiplexer 663. Multiplexer 663 routes the Q value to the lower branch of the circuit. Now that both the I and Q values are present at the interface, they can be provided to the baseband processor 660 by way of analog-to-digital converters 664.

In various embodiments, the hold circuit 667 can be placed in the Q arm instead of the I arm, or a hold circuit can be placed in both the I arm and the Q arm. The DSP 668 (e.g., digital tuners and cross connections can be further configured to provide interpolation to ensure correct I and Q values, time aligned to the same instant of time. The hold circuit may be configured to ensure that the value (in the illustrated example the I value) is held long enough for the Q value to be provided such that simultaneous sampling by the baseband I and Q analog-to-digital converters (e.g. analog-to-digital converters 664). In various embodiments, the precision of the hold circuit is configured to be consistent with the required resolution of the baseband analog-to-digital converters. With this configuration, the I and Q signals upon sampling by the analog-to-digital converters can be made to appear identical to two separate digital-to-analog converters (or other sources) driving the baseband analog-to-digital converters. In various embodiments, the multiplexing rate is at least two times higher than the baseband analog-to-digital converter sampling rate. This allows the values to be loaded in time for sampling.

Figure 10:
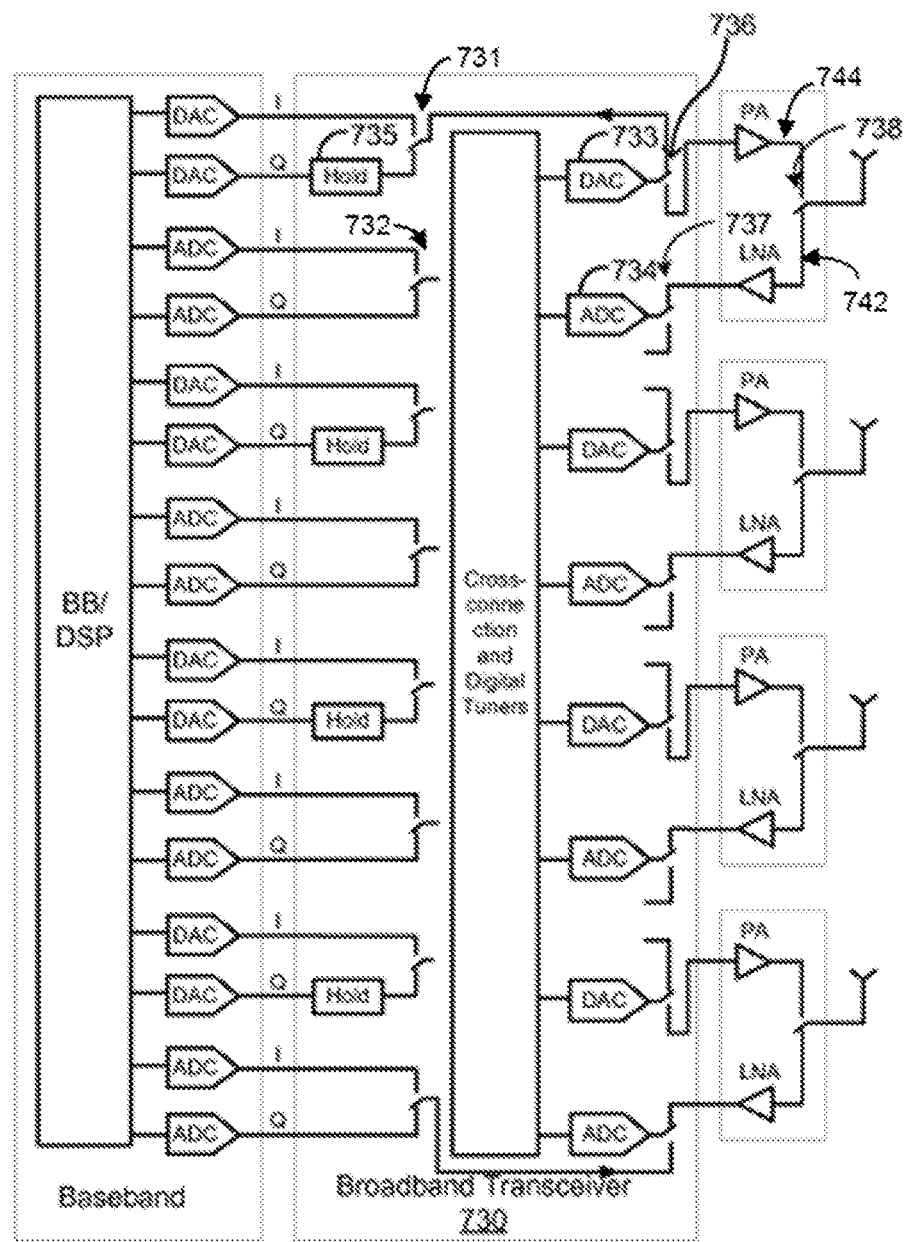
FIG. 10 is a diagram illustrating an example of an implementation of a shared ADC/DAC interface in an exemplary 4×4 MIMO configuration in accordance with one embodiment of the technology disclosed herein.

The savings in circuit complexity, power consumption, and real estate can be even more dramatic when implemented with a multichannel transceiver such as, for example, a MIMO transceiver. FIG. 10 is a diagram illustrating an example of an implementation of the efficient interface (e.g., such as that shown in FIG. 6) in a 4×4 MIMO configuration in accordance with one embodiment of the technology disclosed herein. In this example, there are four transmit and receive paths in this 4×4 MIMO configuration. Each of the transmit and receive paths (e.g., each transmit/receive pair) in the transceiver 730 includes a single digital-to-analog converter 733, a single analog-to-digital converter 734, a hold circuit 735, switches 736, 737, and 738, and multiplexers 731, 732. For clarity of illustration, reference characters are included only on the topmost transmit/receive pair in FIG. 10. Also for clarity of illustration, receive signal path 742 and transmit signal path 744 are illustrated only for the top and bottom transmit path and receive path, respectively. After reading this description, one of ordinary skill in the art will appreciate that similar connections are made between the digital-to-analog converter and multiplexer for the other receive paths and the multiplexer and analog-to-digital converter for the other transmit paths.

Figure 11:
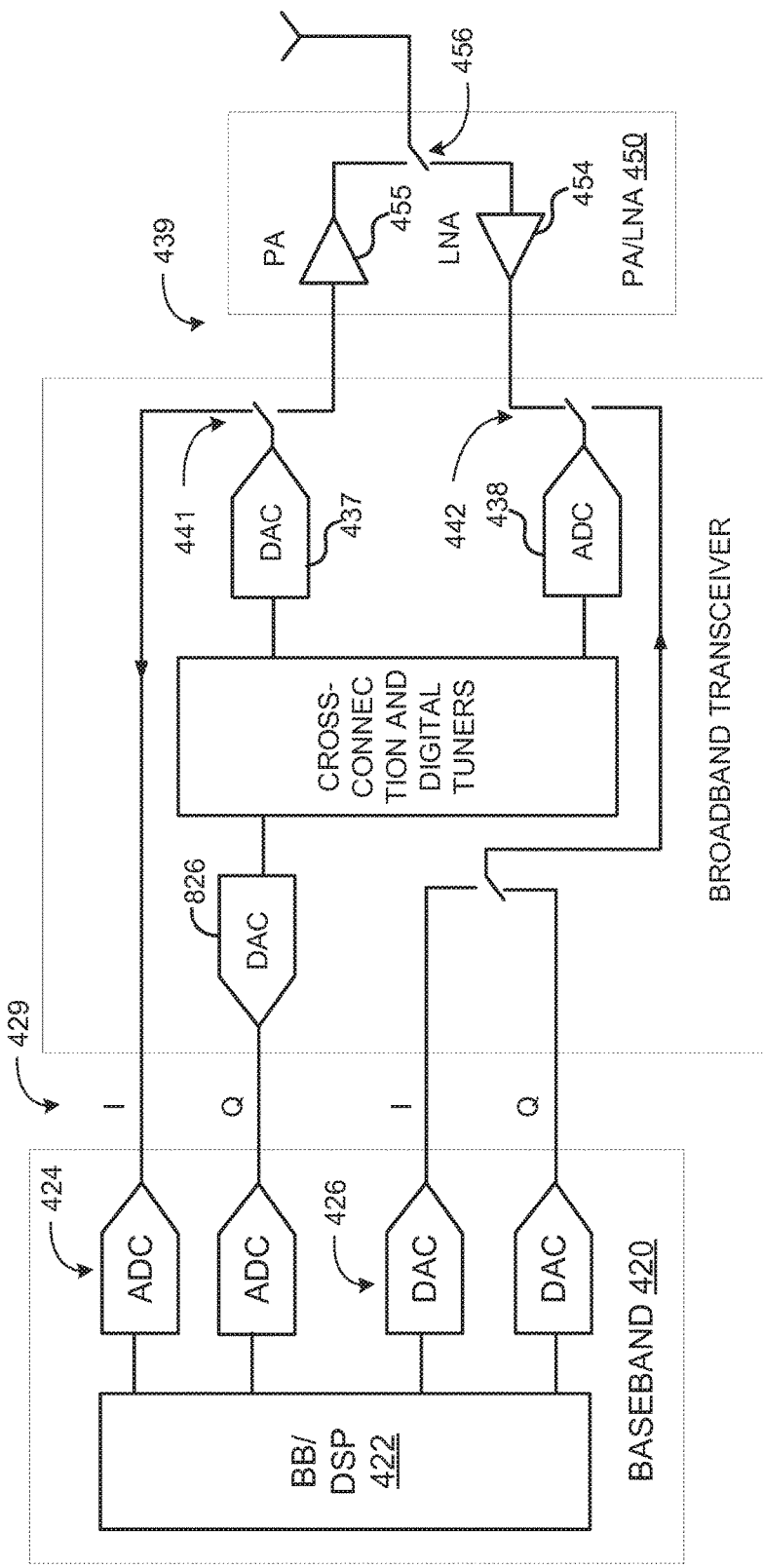
FIG. 11 is a diagram illustrating another example of shared analog-to-digital and digital-to-analog converters in accordance with one embodiment of the technology disclosed herein.

Embodiments can be implemented that do not utilize a hold circuit. Particularly, in one embodiment, an additional digital-to-analog converter can be provided at the output of the digital tuners to provide the I and Q signals on separate analog paths for sampling by the baseband analog-to-digital converters. An example of this is illustrated at FIG. 11. For ease of understanding, as well as for ease of comparison between FIG. 11 and FIG. 6, similar components are provided with the same reference numbers. As seen in the example of FIG. 11, sample and hold module 431 and demultiplexer 432 have been eliminated and instead, an additional digital-to-analog converter 826 is provided. In this embodiment, for receive operations, the I signal is routed through digital-to-analog converter 437 to baseband module 420 and the Q signal is routed by digital-to-analog converter 826 to baseband module 420. In other embodiments, the I and Q signals can be reversed. This example embodiment eliminates the hold circuit by introducing a second digital-to-analog converter for one of the baseband ports. Reusing the output (RF) digital-to-analog converter 437 for the other baseband signal still allow some efficiencies to be gained through reuse. While the embodiment of FIG. 6 can save to analog-to-digital converters and two digital-to-analog converters per antenna, this embodiment saves to analog-to-digital converters and one digital-to-analog converter per antenna.

As this example illustrates, transceiver 730 uses a total of eight analog-to-digital and digital-to-analog converters for transmit and receive operations for the 4×4 MIMO configuration. This can be compared to solutions such as that shown in FIG. 4 in which transceiver 330 would require 24 analog-to-digital and digital-to-analog converters for a 4×4 MIMO configuration. The example transceiver 730 shown in FIG. 10 can accordingly provide in various embodiments a drop-in replacement for the solution shown in FIG. 3. Accordingly, operations such as filtering, modulation and demodulation can be provided in digital form as compared to the solution of FIG. 3, without requiring 16 additional digital-to-analog and analog-to-digital converters.

In accordance with other aspects of the technology disclosed herein, circuits, such as digital-to-analog converters, can also be shared in transmitters implementing digital dynamic bias control. In some communication systems, dynamic biasing of the transmitter power amplifier (PA) may be implemented to improve transmitter efficiency. Dynamic biasing may be especially useful with applications requiring linear amplification. Consider for example the IEEE 802.11 a/g/n/ac OFDM physical layer. OFDM signals in general have an RF power exhibiting a high peak-to-average power ratio. This can often be around 13 dB (i.e., 20 times). Most of the time, the RF power is around the average power (RMS) by definition, with short (generally) excursions to higher and lower power levels.

Figure 12:
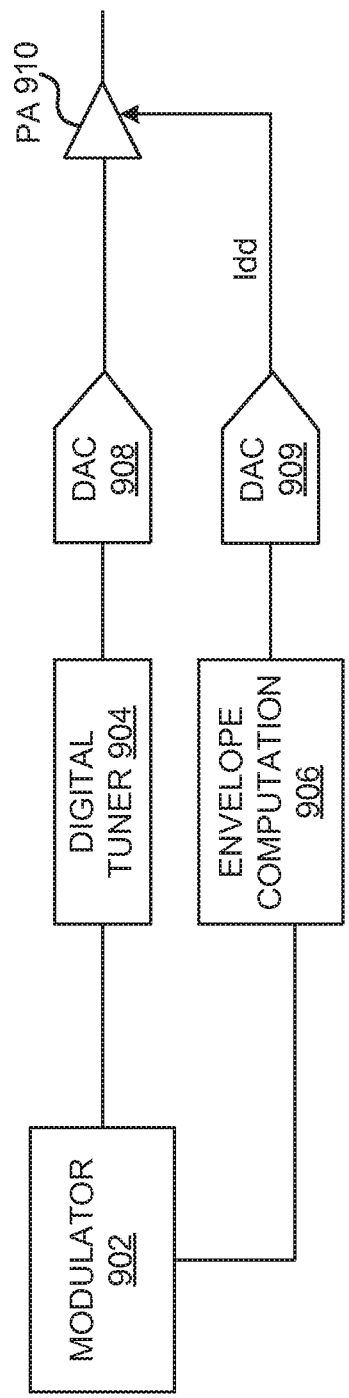
FIG. 12 is a diagram illustrating an example of dynamic biasing in accordance with one embodiment of the technology described herein.

FIG. 12 is a diagram illustrating an example of dynamic biasing in accordance with one embodiment of the technology described herein. In this example, a modulator 902 and a digital tuner 904 are used to modulate the data to be transmitted onto the appropriate carrier or carriers. In the case of OFDM, multiple orthogonal carriers can be used for the physical layer of the communications interface.

The modulation in digital tuning can be done in the digital domain such as, for example, using digital signal processors or other circuitry. In the embodiment illustrated in FIG. 12, the modulated signal from digital tuner 904 is a digital signal. Digital-to-analog converter 908 converts the digital signal into an analog RF signal and sends it to the power amplifier 910 to generate the amplified RF output.

For dynamic bias control, an envelope computation module 906 is included. Envelope computation module 906 computes the envelope of the modulated signal (digitally in this example) and uses this to the power amplifier to control the bias. In some embodiments, envelope computation module 906 may be configured to track the envelope of the RF signal, and generate a bias signal to control the power amplifier so that it only uses as much power as needed to pass the signal and provide an output within specification. In various embodiments, the envelope computation module 906 may be configured to compute the complement of the envelope, which may be used to reduce the digital-to-analog converter's 909 dynamic range requirements.

In various embodiments, some margin may be built into the calculation to ensure enough power is present. For digital applications such as the one shown in FIG. 12, digital-to-analog converter 909 can convert the digital signal into a bias current (Idd) that is provided to control power amplifier 910. As described above, the bias current Idd of power amplifier 910 is controlled based on the envelope of the modulated signal. The higher the envelope, the higher the bias current Idd. Accordingly, the average power dissipation may be reduced.

As this example illustrates, a downside of this configuration is that a separate digital-to-analog converter (DAC 909) is used to provide the bias current. For example, for a 160 MHz envelope, digital-to-analog converter sampling at ≥320 MHz is required to provide the appropriate resolution. Note that an additional pin is also needed for the additional output (two pins for differential signals).

Figure 13:
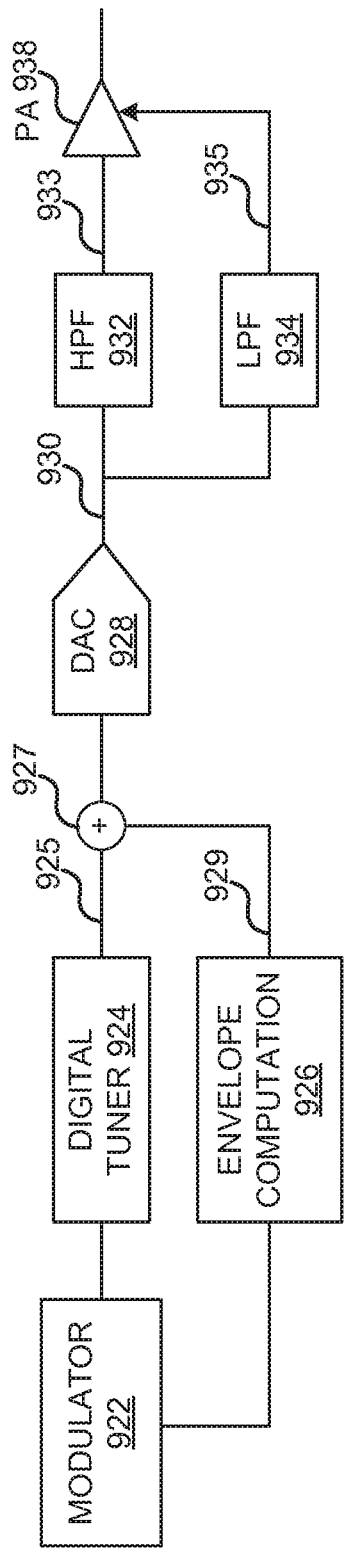
FIG. 13 is a diagram illustrating another example of dynamic biasing in accordance with one embodiment of the technology described herein.

In some embodiments of the technology disclosed herein a single digital-to-analog converter can be used to provide the RF signal and the bias signal to the power amplifier. This can be done to avoid the need for a separate digital-to-analog converter for the bias signal (e.g. digital-to-analog converter 909). FIG. 13 is a diagram illustrating an example digital dynamic bias circuit including a shared DAC in accordance with one embodiment of the technology disclosed herein. Referring now to FIG. 13, this example also includes a modulator 922 and digital tuner 924 to provide modulation of the transmit signal onto an appropriate carrier. This example also includes an envelope computation module 926 to determine the envelope of the modulated signal and to compute the bias control signal. In various embodiments, modulator 922, digital tuner 924, and envelope computation module 926 can be implemented the same as or similar to modulator 902, digital tuner 904, and envelope computation module 906, as illustrated in the example of FIG. 12.

This embodiment takes advantage of the fact that the RF signal and the envelope are separated in frequency. In typical applications, the RF signal and the envelope are sufficiently separated in frequency such that they can be combined without destructively interfering with one another. Accordingly, they may be combined and sent to the power amplifier on the same line, and then they can be separated back out from the combined signal using filters. Therefore, as seen in the example of FIG. 13, the envelope bias signal 929 and the modulated RF signal 925 (both still in digital form) are combined using a combiner 927. The combined digital signal is converted to analog form by digital-to-analog converter 928, producing a combined signal 930 including the modulated RF signal 925 and the envelope bias signal 929. Because the signal is combined, a single digital-to-analog converter may be used to convert the signal to analog form. This combined signal 930 is sent to a high pass filter 932 and a low pass filter 934 to separate it out into its constituent components. High pass filter 932 effectively blocks (filters out) the envelope signal, which is lower in frequency, and passes the higher-frequency RF signal 933 to power amplifier 938. Similarly, low pass filter 934 blocks or filters out the RF signal and passes the envelope bias signal 935 as a bias control for power amplifier 938. In various embodiments, a signal is said to be filtered out by the respective filter if the filter sufficiently suppresses that signal (e.g., by a determined number of dB) so that the filtered out signal does not interfere with the operation of the transmitter. For example, the bias signal may be said to be filtered out of the combined signal by the high pass filter 932 if the amount of interference caused by any remaining bias signal at the output of the high pass filter 932 is sufficiently small enough so as to not cause the system to operate outside of its intended specifications. similarly, the modulated data signal may be said to be filtered out of the combined signal by the low pass filter 934 if the amount of interference caused by any remaining data signal at the output of the low pass filter 934 is sufficiently small so as to not cause the system to operate outside of its intended specifications.

Typically, the envelope frequency spans the range from DC to the channel bandwidth. For WiFi as an example, the envelope is from DC to 160 MHz, while the RF is in the gigahertz range (e.g. 5.8 GHz). These differences in frequency are easily separable using the diplexer as illustrated in FIG. 13 (i.e., the high pass filter/low pass filter combination). Although not shown in FIG. 13, an adaptive filter can be included to equalize the envelope bias signal with the RF signal 933 so that they are time and amplitude aligned at power amplifier 938. An example of this is shown in FIG. 14.

Figure 14:
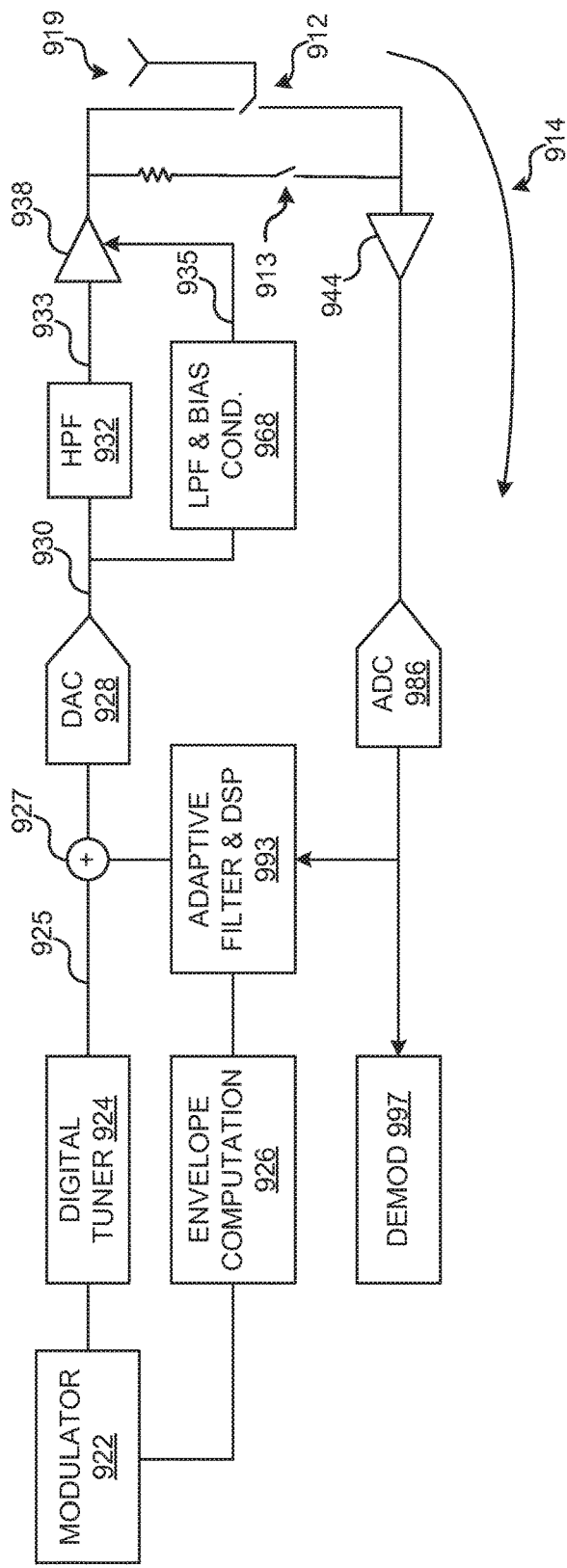
FIG. 14 is a diagram illustrating yet another example of dynamic biasing in accordance with one embodiment of the technology described herein. In this example, an adaptive filter is included to equalize the envelope bias signal with the RF signal.

FIG. 14 illustrates yet another example of dynamic bias in accordance with one embodiment of the technology disclosed herein. Like the example of FIG. 13, the example of FIG. 14 includes a modulator 922, a digital tuner 924, an envelope computation module 926, a combiner 927, a digital-to-analog converter 928, a high pass filter 932, and a power amplifier 938. These components may be implemented using the same or similar components as described above with reference to FIG. 13. This example further includes an adaptive filter module 993. In various embodiments, the adaptive filter module 993 can be implemented to provide equalization/matching of the envelope bias signal 929 to the modulated RF signal 925 output by digital tuner 924. In various embodiments, adaptive filter module 993 can be implemented using, for example, a digital signal processor.

In various embodiments, because the RF signal and the envelope signal are correlated (i.e. both may increase at the same time), the dynamic range of digital-to-analog converter 928 can be high enough to accommodate this correlated increase. For example, in some embodiments, digital-to-analog converter 928 can be specified to have an extra bit in the effective number of bits (ENOB). In other embodiments, the envelope signal combined with the RF signal can be a complement of the envelope instead of the envelope itself. For example, the system can send a 1-e(t) normalized term instead of e(t) so that the envelope bias signal and the RF envelope signal are out of phase with one another. Therefore, when one is high, the other is low, and vice versa. As a result, an extra bit is not needed in the digital-to-analog converter 928. In such embodiments, the low pass filter module 968 can be expanded to include bias conditioning, which can be configured to extract the original envelope for the modulated data signal, e(t), to ensure that the envelope bias is in phase with, or substantially in phase with, the RF signal.

In TDD systems, switches 912, 913 can be included to switch between transmit and receive modes for the transceiver. Switch 912 can be included to communicatively couple the antenna 919 to power amplifier 938 for transmit operations, or to low noise amplifier 944 for receive operations. Switch 913 can be closed during transmit operations to allow the receive path to provide a return path 914 for purposes of training the adaptive filter. This same path 914 can be used to measure the signal distortion and perform pre-distortion in a DSP to improve the output signal quality. For example, this can be used to improve EVM, reduce nonlinear distortion and have channel emissions, and so on.

For receive operations, switch 912 is switched to connect antenna 919 to low noise amplifier 944, and switch 913 is opened. Analog-to-digital converter 986 digitizes signals on path 914 for digital demodulation by demodulator 997 or for operation by adaptive filter module 993.

As noted above, adaptive filter module 993, can be implemented using a digital signal processor. In various embodiments, other components operating in the digital domain in this and other embodiments may also be implemented using a DSP. In some embodiments, the digital, mixed signal, and analog (i.e. RF/PA) can be implemented using a monolithic module, a multichip module, or separate components in separate packages.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various Features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A communication system, comprising:
   a digital tuner operable to receive an unmodulated signal and operable to output a digital radio frequency (RF) signal;
   a digital combiner operable to receive the digital RF signal and operable to output a biased RF signal;
   a digital to analog converter (DAC) operable to convert the biased RF signal into an analog RF signal;
   a power amplifier having a signal input, a control input and an output;
   a high pass filter operable to high pass filter the analog RF signal, the high pass filtered analog RF signal being coupled to the signal input of the power amplifier; and
   a low pass filter operable to low pass filter the analog RF signal, the low pass filtered analog RF signal being coupled to the control input of the power amplifier.

2. The communication system of claim 1, wherein the high pass filter is configured to filter out a bias signal from the analog RF signal.

3. The communication system of claim 1, wherein the control input of the power amplifier is operable to control a bias of the power amplifier.

4. The communication system of claim 1, wherein the digital RF signal comprises a data signal modulated on a carrier.

5. The communication system of claim 1, wherein the DAC comprises the digital combiner.

6. The communication system of claim 1, wherein an envelope computation module is configured to compute a bias for the biased RF signal.

7. The communication system of claim 6, comprising an adaptive filter coupled between the envelope computation module and the digital combiner.

8. The communication system of claim 7, wherein the adaptive filter has an input coupled to an output of the envelope computation module and an output coupled to a second input of the digital combiner.

9. The communication system of claim 8, comprising a return path coupled to a second input of the adaptive filter to provide signal information to train the adaptive filter.

10. The communication system of claim 8, wherein the adaptive filter is configured to measure signal distortion and provide pre-distortion for the communication system.

11. The communication system of claim 1, comprising a bias conditioner to extract an original envelope for a modulated data signal in accordance with a phase of the analog RF signal.

12. A method for controlling a power amplifier, comprising:
   combining a digital RF signal, generated from an unmodulated signal by a digital tuner, with a digital bias signal to generate a biased digital RF signal, the digital bias signal being generated according to an envelope of the digital RF signal;
   converting, by a digital-to-analog converter, the biased digital RF signal into an analog RF signal, the analog RF signal comprising a high frequency analog modulated data signal and a low frequency analog envelope bias signal;

separating the high frequency analog modulated data signal from the low frequency analog envelope bias signal; and using the power amplifier to amplify the high frequency analog modulated data signal by a gain determined according to the low frequency analog envelope bias signal.

13. The method of claim 12, wherein the combining is performed using the digital-to-analog converter.

14. The method of claim 12, wherein the separating comprises filtering out the low frequency analog envelope bias signal from the analog RF signal and passing the high frequency analog modulated data signal to the power amplifier for amplification.

15. The method of claim 12, wherein the separating comprises filtering out the high frequency analog modulated data signal from the analog RF signal and passing the low frequency analog envelope bias signal to a control input of the power amplifier to control the bias of the power amplifier.

16. The method of claim 12, comprising computing a complement of the envelope.

17. The method of claim 12, comprising filtering, using an adaptive filter, the digital bias signal prior to combining it with the digital RF signal.

18. The method of claim 12, comprising extracting the envelope of the high frequency analog modulated data signal to ensure that the low frequency analog envelope bias signal is substantially in phase with the high frequency analog modulated data signal at the power amplifier.

19. The method of claim 12, comprising providing the high frequency analog modulated data signal to an input of the power amplifier, and providing the low frequency analog envelope bias signal to a control input of the power amplifier.

* * * * *